(12) United States Patent
Kinsman

(10) Patent No.: US 6,797,616 B2
(45) Date of Patent: Sep. 28, 2004

(54) CIRCUIT BOARDS CONTAINING VIAS AND METHODS FOR PRODUCING SAME

(75) Inventor: Larry D. Kinsman, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/225,907

(22) Filed: Aug. 21, 2002

(65) Prior Publication Data

US 2003/0068877 A1 Apr. 10, 2003

Related U.S. Application Data

(62) Division of application No. 09/974,947, filed on Oct. 10, 2001.

(51) Int. Cl.⁷ .............................................. H01L 21/44
(52) U.S. Cl. ........................ 438/667; 438/106; 438/108
(58) Field of Search ................................ 438/106, 667, 438/618, 108

(56) References Cited

U.S. PATENT DOCUMENTS

| | | | |
|---|---|---|---|
| 4,052,787 A | 10/1977 | Shaheen et al. | 29/626 |
| 4,211,603 A | 7/1980 | Reed | 216/18 |
| 4,851,615 A | 7/1989 | Butt | 174/68.5 |
| 5,410,172 A | 4/1995 | Koizumi et al. | 257/347 |
| 5,421,083 A | 6/1995 | Suppelsa et al. | 29/852 |
| 5,529,950 A | 6/1996 | Hoenlein et al. | 437/170 |
| 5,891,606 A * | 4/1999 | Brown | 430/312 |
| 5,956,575 A | 9/1999 | Bertin et al. | 438/110 |
| 6,091,137 A | 7/2000 | Fukuda | 257/679 |
| 6,184,579 B1 | 2/2001 | Sasov | 257/712 |
| 6,225,651 B1 | 5/2001 | Billon | 257/200 |
| 6,259,160 B1 | 7/2001 | Lopatin et al. | 257/762 |
| 6,262,486 B1 | 7/2001 | Farrar | 257/758 |
| 6,268,238 B1 | 7/2001 | Davidson et al. | 438/107 |
| 6,284,108 B1 * | 9/2001 | DiFrancesco | 204/224 R |
| 6,400,010 B1 | 6/2002 | Murata | 257/706 |
| 2001/0055891 A1 | 12/2001 | Ko et al. | 438/780 |
| 2002/0053465 A1 | 5/2002 | Kawakita et al. | 174/256 |
| 2003/0038344 A1 | 2/2003 | Palmer et al. | 257/621 |
| 2003/0047809 A1 * | 3/2003 | Takeuchi et al. | 257/758 |

* cited by examiner

*Primary Examiner*—Amir Zarabian
*Assistant Examiner*—Pamela E Perkins
(74) *Attorney, Agent, or Firm*—Dorsey & Whitney LLP

(57) ABSTRACT

The present invention is directed to an apparatus and method for connecting integrated circuits placed on opposite sides of a circuit board through utilization of conduction elements embedded in the circuit board and extending from one surface of the board to the other. Conductive traces extend along the surface of the circuit board from the conduction elements to the integrated circuits. The conductive traces may be formed from multiple conductive layers.

22 Claims, 5 Drawing Sheets

US 6,797,616 B2

CIRCUIT BOARDS CONTAINING VIAS AND METHODS FOR PRODUCING SAME

CROSS-REFERENCE TO RELATED APPLICATION

This application is a divisional of pending U.S. patent application Ser. No. 09/974,947, filed Oct. 10, 2001.

TECHNICAL FIELD

This invention relates generally to structures for interconnecting integrated circuits disposed on opposite sides of an insulating substrate. More specifically, the present invention relates to methods and apparatus for enabling electronic components mounted on both sides of an insulating substrate to communicate electrically without having to remove areas of the substrate to form a via.

BACKGROUND OF THE INVENTION

A main focus of the contemporary semiconductor industry is miniaturization, which is furthered by increasing the density at which integrated circuits are mounted on a substrate, such as a printed circuit board. Miniaturization enables the design and manufacture of increasingly smaller and more compact devices such as hand-held computers, personal data assistants (PDA) and portable telecommunications devices.

One way to satisfy the demand for increased integrated circuit density is to attach integrated circuits to opposing sides of a dielectric circuit board. A technique developed by the semiconductor industry to couple integrated circuits positioned on opposite sides of a circuit board to each other has been the creation of conductive vias through circuit boards. FIG. 1 is a partial isometric view of a circuit board 1 comprising a substrate 8 with holes 10 extending through its thickness 11 in any desired arrangement according to the prior art. The substrate 8 may comprise a BT or FR dielectric core, and the methods used to make the holes 10 include drilling, etching and laser ablation.

The circuit board 1 is shown in greater detail in FIG. 2, which is a partial cross-sectional view of the circuit board 1 at a later stage of production. After the holes 10 have been formed in the substrate 8, they are plated to form conductive linings 12. The conductive linings 12 extend from the first surface 15 of the substrate 8 to the second surface 16 of the substrate 8. The lining 12 is generally comprised of copper, but any other conductive material may be used. Conductive traces 13 are also deposited on the first and second surfaces 15 and 16 of the substrate 8. The conductive traces 13 couple integrated circuits to other integrated circuits mounted on the same surface 15, 16. Additionally, the conductive traces 13 couple integrated circuits to the linings 12.

A solder mask 14 may then be applied to both the first surface 15 and the second surface 16 to insulate conductive traces 13 and conductive via linings 12, and to protect them from deleterious environmental factors such as dust or moisture. Areas of the traces 13 and linings 12 to which conductive integrated circuit leads will be soldered are left uncoated by the solder mask 14. Integrated circuits (not shown) are then soldered to the traces 13 on the first surface 15 and the second surface 16.

There are several problems associated with this type of prior art technique however, with perhaps the most significant being the limited density at which vias may be formed. Each via must inherently have a diameter 18 greater than the diameter 17 of its hole 10 to enable traces 13 to connect to the via. This outer diameter 18 of the contact surface, or contact pad 19, typically amounts to twice the diameter 17 of the hole 10. Therefore, even if the diameter of the holes 10 could be decreased, the density of the vias would still be limited by the outer diameter 18 of the contact pad 19.

Presently, holes 10 can be drilled with diameters as small as 50 μm. This limitation arises due to difficulties in forming narrow holes 10 in the substrate 8, as well as difficulties in plating the inner surfaces of the holes 10. As a consequence, after the addition of the necessary capture pad, the prior art cannot create vias with diameters of less than 100 μm. This significantly constrains efforts to increase circuit board density, and prevents the development of smaller and more compact electronic devices.

What is needed is a method of electrically coupling two integrated circuits on opposite sides of a circuit board without the prior art solution of creating and filling holes in the circuit board.

SUMMARY OF THE INVENTION

The present invention is directed to an apparatus and method for connecting integrated circuits placed on opposite sides of a circuit board through utilization of conduction elements embedded in the circuit board. The conduction elements extend from one surface of the circuit board to the other. Conductive traces coupled to integrated circuits make contact with the conduction elements to allow integrated circuits mounted on opposite surfaces of the board to be coupled to each other.

DETAILED DESCRIPTION OF THE INVENTION

The present invention is directed to an apparatus and method for connecting integrated circuits placed on opposite sides of a circuit board through utilization of conduction elements embedded in the circuit board. Many of the specific details of certain embodiments of the invention are set forth in the following description and in FIGS. 3 through 11 to provide a thorough understanding of such embodiments. One skilled in the art will understand, however, that the present invention may be practiced without several of the details described in the following description.

Figure 1:
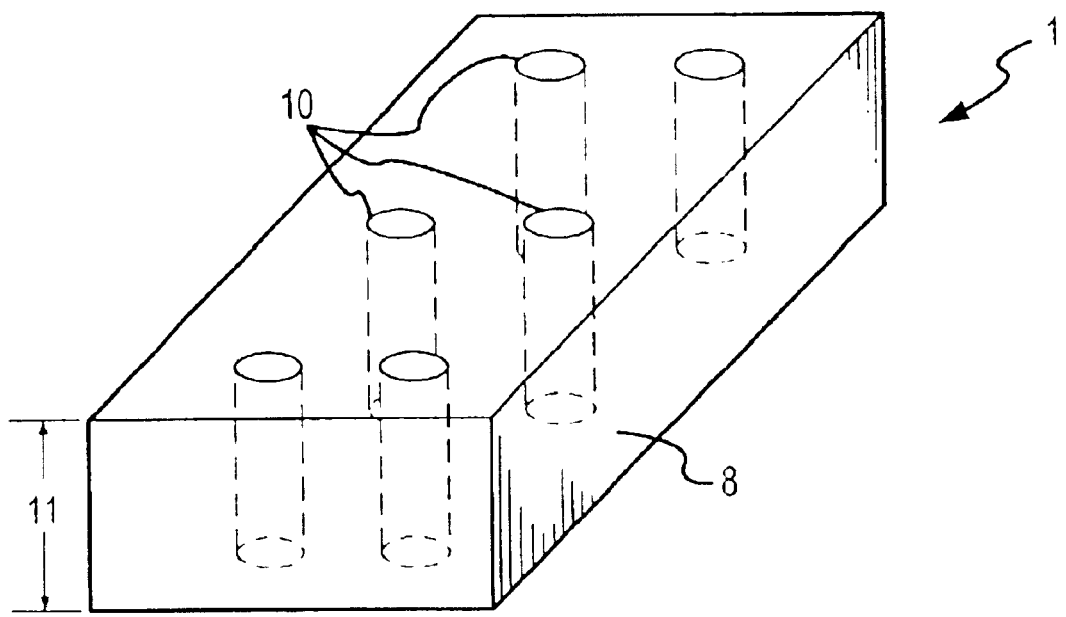
FIG. 1 is a partial isometric view of a circuit board with vias created therein.
Figure 2:
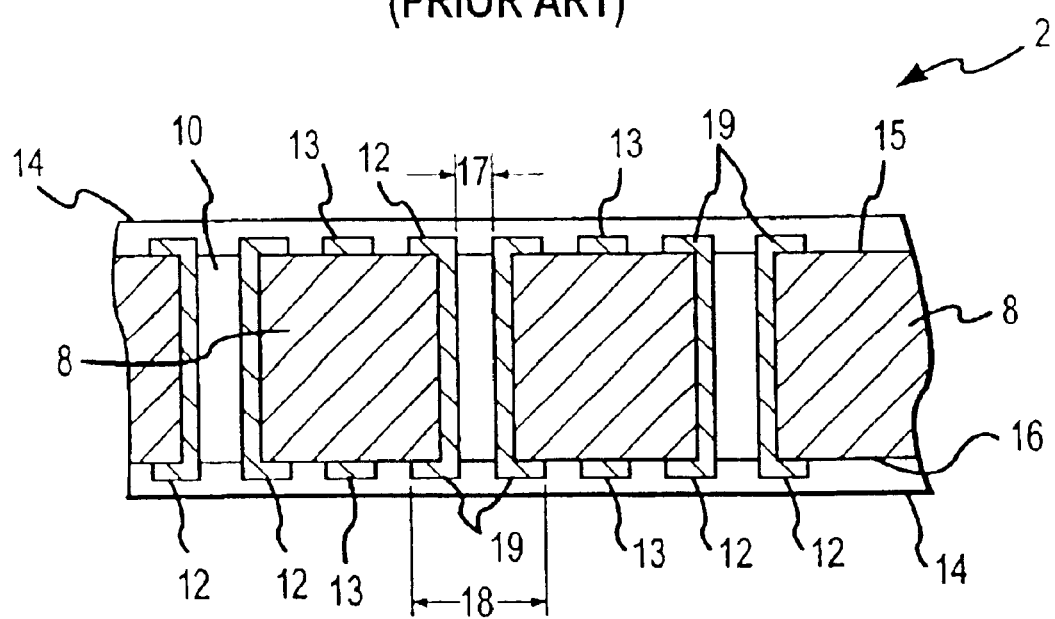
FIG. 2 is a partial cross-sectional view of a circuit board with vias upon which a conductive medium has been applied.
Figure 3:
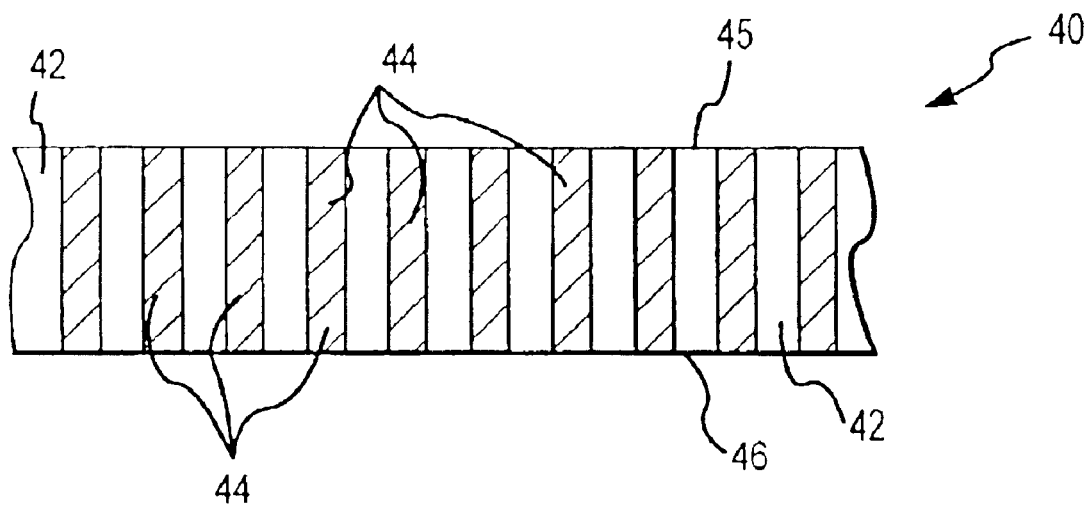
FIG. 3 is a partial cross-sectional view of a circuit board with embedded electric conduction elements.

FIG. 3 is a partial cross-sectional view of a circuit board 40 comprising a substrate 42 with a plurality of embedded electric conduction elements 44 extending from the first surface 45 of the substrate 42 to the second surface 46 of the substrate 42. The electric conduction elements 44 commonly comprise thin conductive fiber and may be configured to intersect the first surface 45 and the second surface 46 wherever desired. The electric conduction elements 44 may be any size desired and they are preferably oriented substantially orthogonal to the first surface 45 and the second surface 46.

Because of the solid composition of the conduction elements 44, cumbersome capture pads such as those described above in the prior art discussion are not needed by the invention. As a result, via diameters as small as 25 μm or less can be achieved, permitting the invention to create vias one-fourth of the size of those found in the prior art. As a consequence, the invention enables manufacturers to increase the density of integrated circuits mounted on both sides of a substrate.

The electric conduction elements 44 may comprise copper, aluminum or any other conductive material known in the art. The circuit board 40 can be produced using a process similar to that found in current manufacturing techniques employed to create resilient interposers having conductors embedded in a resilient substrate.

Figure 4:
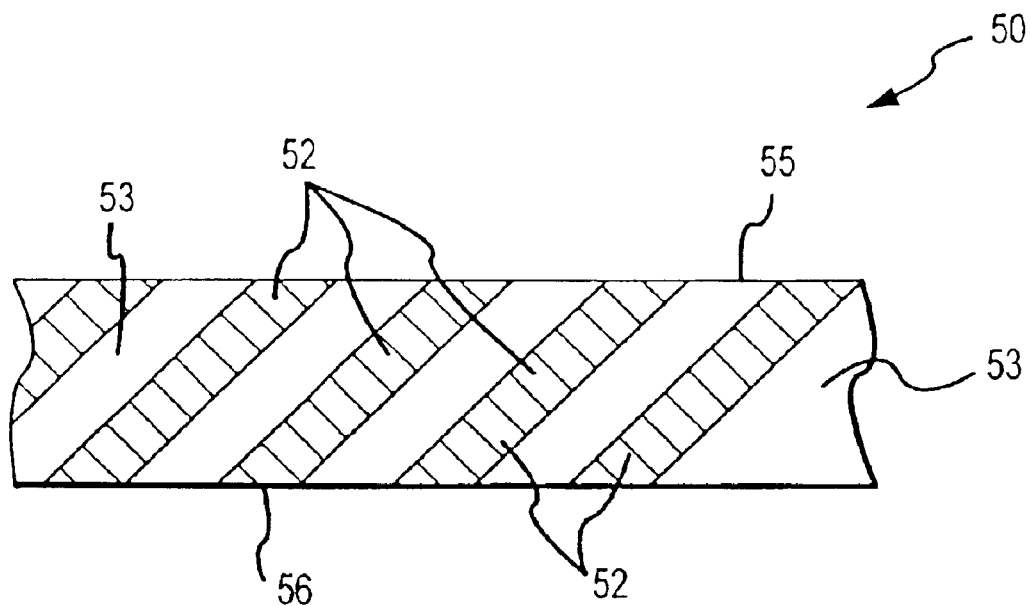
FIG. 4 is a partial cross-sectional view of a circuit board illustrating a further embodiment of the electric conduction elements which are also seen in FIG. 3.

FIG. 4 shows another embodiment of the invention in a partial cross-sectional view of a circuit board 50 having electric conduction elements 52 extending through substrate 53 at oblique angles to the first surface 55 and the second surface 56.

Figure 5:
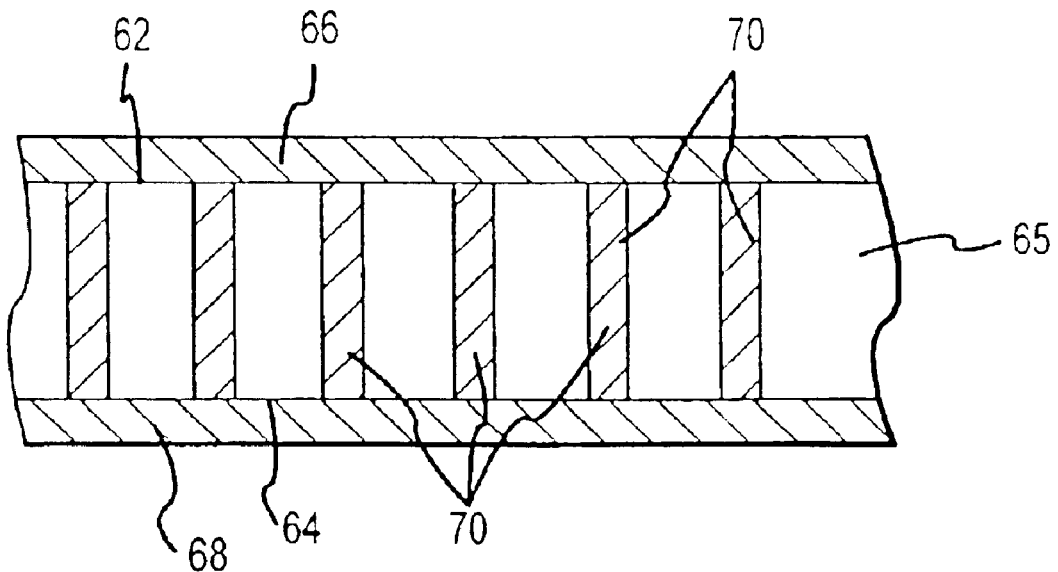
FIGS. 5–7 illustrate the operations to connect the electric conduction elements to electrical components in one embodiment of the present invention.

The manner in which the circuit boards 40 and 50 of FIGS. 3 and 4 can be used to connect integrated circuits on opposite sides of a circuit board will now be explained with reference to FIGS. 5–8. As shown in FIG. 5, the first surface 62 and the second surface 64 of a substrate 65 are coated with a first insulating layer 66 and second insulating layer 68, respectively. Insulating layers 66 and 68 may comprise prepreg and may be deposited by any conventional means known in the art.

The insulating layers 66 and 68 cover both ends of electric conduction elements 70 at the first surface 62 and the second surface 64. The insulating layers 66, 68 insulate the conduction elements 70 from conductive traces (not shown) that will be formed on the circuit board, as subsequently explained.

Figure 6:
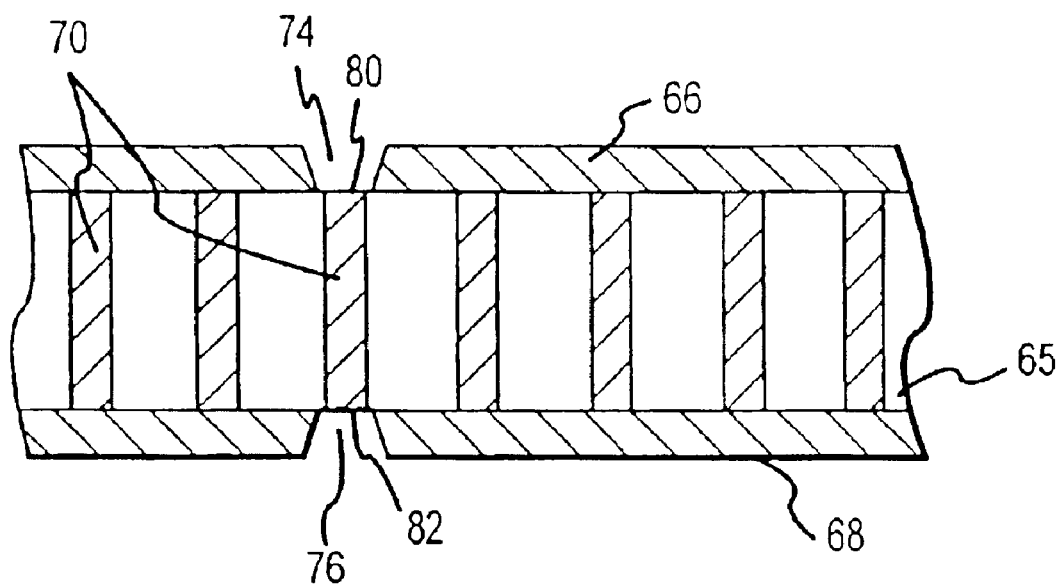

To use each conduction element 70 to couple an integrated circuit on one side of the board to an integrated circuit on the other side, portions of both the first insulating layer 66 and the second insulating layer 68 are removed as shown in FIG. 6. Removing portions of the insulating layers 66 and 68 form a first recess 74 and a second recess 76, respectively. A first end 80 and a second end 82 of a selected electric conduction element 70 are exposed in the first and second recesses 74, 76, respectively. The ends 80 and 82 under the insulating layers 66 and 68 can be located using photo lithography or by other means. The first and second recesses 74 and 76 may be created by use of milling, laser ablation, etching or other techniques known in the art.

Figure 7:
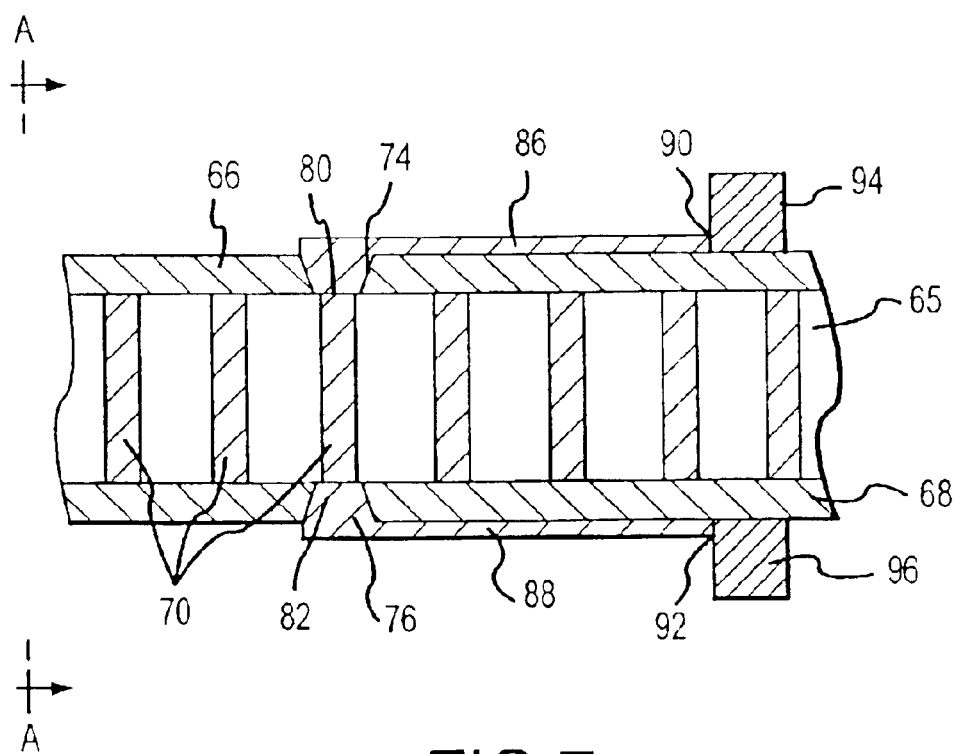

Given the sensitivity of photolithography techniques, the location of an electric conduction element 70 can be very precisely determined using the invention. In contrast, the prior art placement of a via by drilling a hole through a substrate is much less precise, owing to the difficulties in controlling such drilling processes. Moreover, the invention affords great flexibility in the creation of vias, since all that is required to form a via is the creation of recesses over conduction elements. This is much less cumbersome than the drilling and plating processes required by the prior art In order to describe the completion of the electric connection of two electric components on opposite sides of the circuit board, FIGS. 7 and 8 will be discussed concurrently. FIG. 7 is a partial cross-sectional view along axis A—A of the circuit board shown in partial top plan view in FIG. 8. Looking at FIG. 7, first and second conductive traces 86, 88 are formed on the respective insulating layers 66, 68. The conductive traces 86 and 88 extend into the first and second recesses 74 and 76, respectively, to contact the first and second ends 80 and 82, respectively, of the electric conduction element 70. The first and second conductive traces 86 and 88 also extend to respective conductive terminals 90 and 92 of a first electrical component 94 and a second electrical component 96, respectively. The electrical components 94, 96 may be integrated circuits or some other passive or active electrical component. The first and second conductive traces 86 and 88 may comprise deposited copper, aluminum, or any other conductive material known in the art, and may be formed by any means such as conventional techniques for forming conductive traces on printed circuit boards.

Figure 8:
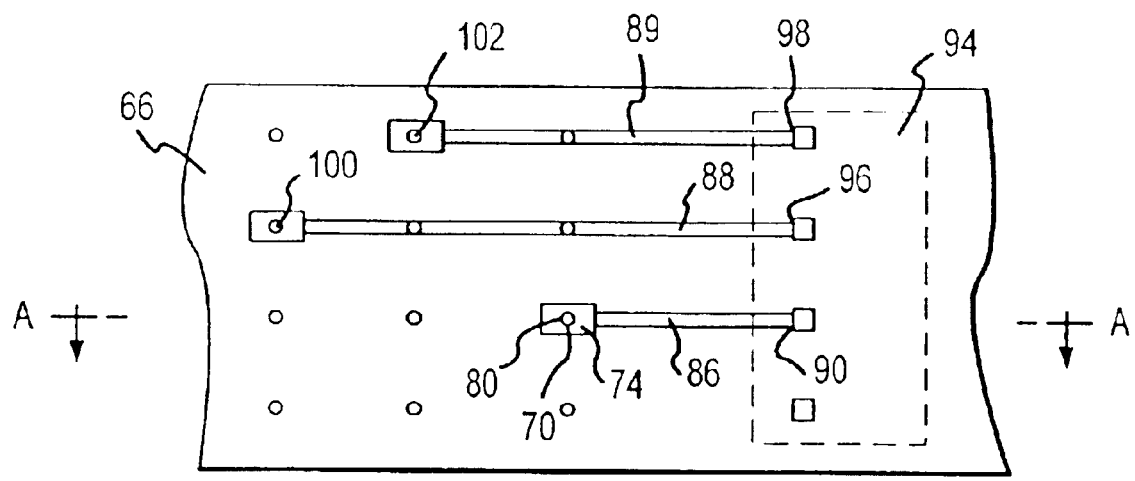
FIG. 8 shows a partial top plan view of a circuit board illustrating conductive mediums coupling electrical conduction elements to the conductive terminals of an integrated circuit.

As shown in FIG. 8, a plurality of conductive traces 86, 88, 89 may run from a single electrical component 94, connecting respective conductive terminals 90, 96, 98 to conduction elements 70, 100, 102, respectively. There need not be a plurality of conductive terminals, however, as some electrical components may have as few as one conductive terminal.

Figure 9:
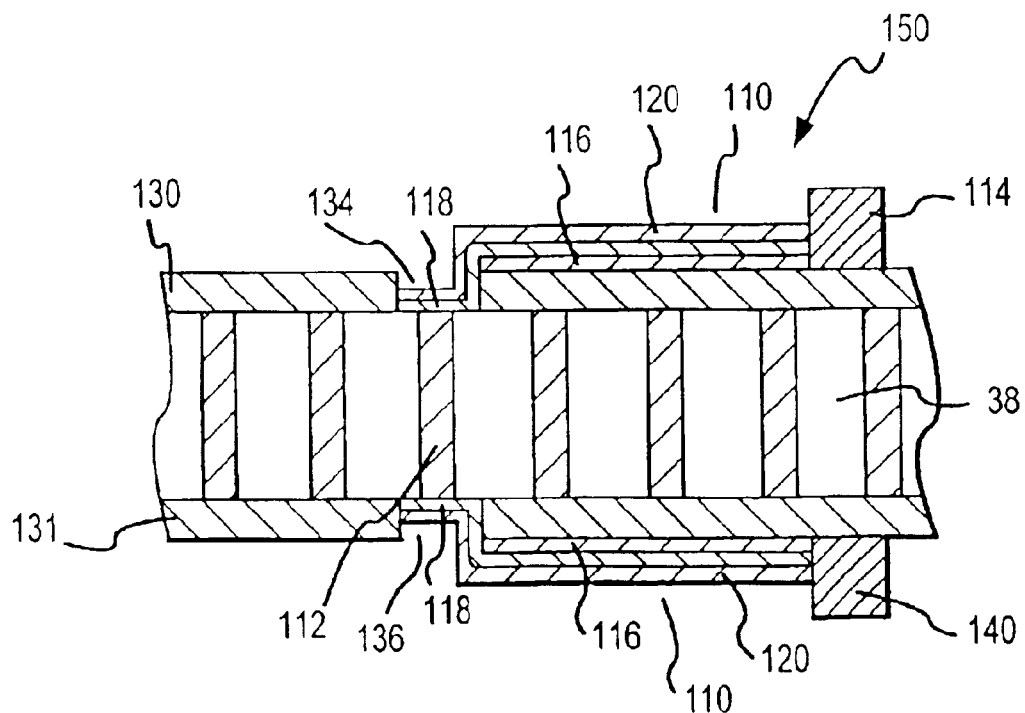
FIG. 9 is a partial cross-sectional view of a circuit board illustrating a further structure used to connect the electric conduction elements to an electrical component.

The composition of the conductive traces of one embodiment of the invention is illustrated in FIG. 9. In this embodiment, conductive traces 110 extend between an electric conduction element 112 and electrical components 114, 140. The traces 110 may comprise a plurality of conductive layers 116, 118 and 120.

The construction of the traces 110 comprises a multi-step process wherein a first conductive layer 116 is initially formed on the first and second insulating layers 130 and 131. The formation of the first conductive layer 116 may comprise laminating a conductive foil onto the first and second insulating layers 130 and 131, then etching, milling or manipulating by laser ablation techniques unwanted portions away from the foil to form conductive traces. Alternatively, the conductive layer 116 may be formed by first etching or otherwise removing a pre-selected relief pattern into the first and second insulating layers 130 and 131, then depositing a conductor onto the relief pattern. The conductive layer 116 may comprise copper or any other conductive medium known in the art.

The conductive trace formed by the conductive layer 116 extends near but not into the first and second recesses 134 and 136. To extend the conductive trace into the recesses, the entire surface of the first and second insulating layers 130 and 131—including first and second recesses 134 and 136, the exposed ends of the selected electric conduction element 112, and the newly formed first conductive layers 116—is coated with a second conductive layer 118. This operation can comprise flash plating the entire circuit board with a conductive substance or immersing the entire circuit board into a conductive plating fluid. This new coating may then be selectively removed from all areas not covering an etched recess 134 and 136, an exposed end of a selected electric conduction element 112, or a conductive layer 116. The result is the creation of an unbroken conductor extending from the ends of the electric conduction element 112, over the first conductive layers 116, and to the first and second electrical components 114 and 140, respectively.

Optionally, a third conductive layer 120 may also be deposited onto the second conductive layer 118 in order to strengthen the typically thin second conductive layers 118, and to improve the electrical connections with the electric conduction element 112. The third conductive layer 120 can be deposited quickly and cheaply using electrochemical plating techniques, or alternatively, any other deposition technique known in the art may be used. If present, the third conductive layers 120 may then be coupled to the first and second electrical components 114 and 140, respectively, by mounting the components 114 and 140 on the conductive traces 110.

After the successful deposition of the traces 110 by any of the methods chosen from above, a solder mask (not shown) may be applied to the surfaces of the circuit board 150 before the electronic components 114 and 140 are attached.

The above description of illustrated embodiments of the invention is not intended to be exhaustive or to limit the invention to the precise form disclosed. While specific embodiments of, and examples of, the invention are described in the foregoing for illustrative purposes, various equivalent modifications are possible within the scope of invention, as those skilled in the relevant art will recognize. For example, the various embodiments described above can be combined to provide further embodiments. Accordingly, the invention is not limited by the disclosure, but instead the scope of the invention is to be determined entirely by the following claims.

What is claimed is:

1. A method for producing an interconnecting device, comprising:
    embedding a plurality of homogenous, pre-formed electric conduction elements in an insulating substrate having first and second opposed surfaces, the electric conduction elements extending from the first surface to the second surface, wherein embedding further comprises positioning the electric conduction elements in a resin material in a semi-liquid state and curing the resin material to form the insulating substrate;
    applying a first insulating layer to the first surface of the insulating substrate and applying a second insulating layer to the second surface of the insulating substrate;
    removing a portion of the first insulating layer and a portion of the second insulating layer to form respective first and second openings exposing both ends of pre-selected electric conduction elements;
    applying a first conductive medium to overlie the first insulating layer, the first conductive medium extending into the first opening making physical contact with the exposed ends of the electric conduction elements;
    applying a second conductive medium to overlie the second insulating layer, the second conductive medium extending into the second opening making physical contact with the exposed ends of the electric conduction elements.

2. The method according to claim 1 wherein the operation of applying a first insulating layer comprises applying a layer of a dielectric resin material.

3. The method according to claim 1 wherein the operation of applying a second insulating layer comprises applying a layer of a dielectric resin material.

4. The method according to claim 1 wherein the operation of applying the first conductive medium comprises:
    applying a first conductive plate upon which a first conductive cover is applied, the first conductive cover physically contacting the selected conduction elements, and further applying a first conductive overlap onto the first conductive cover.

5. The method according to claim 4 wherein the operation of applying a first conductive cover comprises dipping the interconnecting device into a conductive plating fluid.

6. The method of claim 4 further comprising etching the first plate to create a circuit.

7. The method of claim 1 wherein the operation of applying a first conductive medium comprises applying a layer of copper to the first insulating layer.

8. The method according to claim 1 wherein the operation of applying the second conductive medium comprises:
    applying a second conductive plate upon which a second conductive cover is applied, the second conductive cover physically contacting the selected conduction elements, and further applying a second conductive overlap onto the second conductive cover.

9. The method according to claim 8 wherein the operation of applying a second conductive cover comprises dipping the interconnecting device into a conductive plating fluid.

10. The method of claim 8 further comprising etching the second plate to create a circuit.

11. The method of claim 1 wherein the operation of applying a second conductive medium comprises applying a copper layer to the second insulating layer.

12. A method of fabricating an electronic device comprising:
    embedding a plurality of homogeneous, pre-formed electric conduction elements in an insulating substrate having first and second opposed surfaces, the electric conduction elements extending from the first surface to the second surface, wherein embedding further comprises positioning the electric conduction elements in a non-cured resin material and curing the resin material to form the insulating substrate;
    applying a first insulating layer to the first surface of the insulating substrate and applying a second insulating layer to the second surface of the insulating substrate;
    removing a portion of the first insulating layer and a portion of the second insulating layer to form respective first and second openings exposing both ends of pre-selected electric conduction elements;

applying a first conductive medium to overlie the first insulating layer, the first conductive medium extending into the first openings making physical contact with the exposed ends of the electric conduction elements;

applying a second conductive medium to overlie the second insulating layer, the second conductive medium extending into the second openings making physical contact with the exposed ends of the electric conduction elements;

attaching a first electrical component to the first insulating layer in contact with the first conductive medium;

and attaching a second electrical component to the second insulating layer in contact with the second conductive medium.

13. The method according to claim 12 wherein the operation of applying a first insulating layer comprises applying a layer of a dielectric resin material.

14. The method according to claim 12 wherein the operation of applying a second insulating layer comprises applying a layer of a dielectric resin material.

15. The method according to claim 12 wherein the operation of applying the first conductive medium comprises:

applying a first conductive plate upon which a first conductive cover is applied, the first conductive cover physically contacting the selected conduction elements, and further applying a first conductive overlap onto the first conductive cover.

16. The method according to claim 15 wherein the first cover is disposed onto the electronic device by dipping the electronic device into a conductive plating fluid.

17. The method of claim 15 further comprising etching the first plate to create a circuit.

18. The method of claim 12 wherein the operation of applying a first conductive medium comprises applying a layer of copper to the first insulating layer.

19. The method according to claim 12 wherein the operation of applying the second conductive medium comprises:

applying a second conductive plate upon which a second conductive cover is applied, the second conductive cover physically contacting the selected conduction elements, and further applying a second conductive overlap onto the second conductive cover.

20. The method according to claim 19 wherein the second cover is disposed onto the electronic device by dipping the electronic device into a conductive plating fluid.

21. The method of claim 19 further comprising etching the second plate to create a circuit.

22. The method of claim 12 wherein the operation of applying a second conductive medium comprises applying a layer of copper to the second insulating layer.

* * * * *